(12) United States Patent
Arsenault et al.

(10) Patent No.: US 6,396,256 B1
(45) Date of Patent: May 28, 2002

(54) POWER SUPPLY SLEW TIME TESTING OF ELECTRONIC CIRCUITS

(75) Inventors: Charles E. Arsenault, Westborough; Michael E. Fields, Grafton; Kevin E. Granlund, Sutton, all of MA (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 09/107,741

(22) Filed: Jun. 30, 1998

(51) Int. Cl.[7] ............................................... G01R 31/26
(52) U.S. Cl. ..................... 324/158.1; 324/765; 326/16; 714/724
(58) Field of Search .............................. 324/158.1, 73.1, 324/765, 763, 767, 754; 315/383, 397; 361/56; 326/62, 63, 57, 16, 39; 714/724, 726

(56) References Cited

U.S. PATENT DOCUMENTS

| | | | | |
|---|---|---|---|---|
| 3,725,740 A | * | 4/1973 | Kuster ........................ | 361/56 |
| 3,863,099 A | * | 1/1975 | Owens, Jr. ................... | 315/383 |
| 3,887,842 A | * | 6/1975 | Owens, Jr. et al. ......... | 315/397 |
| 4,507,576 A | | 3/1985 | McCracken et al. .......... | 326/63 |
| 4,646,299 A | * | 2/1987 | Schinabeck et al. ........ | 324/73.1 |
| 4,947,113 A | | 8/1990 | Chism et al. ................ | 324/754 |
| 5,200,696 A | * | 4/1993 | Menis et al. ............. | 324/158.1 |
| 5,331,220 A | | 7/1994 | Pierce et al. ................. | 326/57 |
| 5,521,493 A | * | 5/1996 | Persons .................... | 324/158.1 |
| 5,543,728 A | * | 8/1996 | Grace et al. ................. | 324/763 |
| 5,731,700 A | * | 3/1998 | McDonald ............... | 324/158.1 |

* cited by examiner

*Primary Examiner*—Ernest Karlsen
*Assistant Examiner*—Minh N. Tang
(74) *Attorney, Agent, or Firm*—Wolf, Greenfield & Sacks, P.C.

(57) ABSTRACT

Power supply slew time testing is performed on units that require a power supply for operation. A power supply voltage is applied to a unit under test. The power supply voltage has a test slew time that is selected to evaluate operation of the unit under test in a system. A response of the unit under test to the power supply having the test slew time is observed, and the condition of the unit under test is determined based on the response to the power supply having the test slew time. The test may involve application of the power supply voltage having a maximum test slew time and application of the power supply voltage having a minimum test slew time. The test slew times are selected based on the expected range of power supply slew times when the unit is installed in a system.

15 Claims, 3 Drawing Sheets

POWER SUPPLY SLEW TIME TESTING OF ELECTRONIC CIRCUITS

FIELD OF THE INVENTION

This invention relates to environmental testing of electronic circuits and, more particularly, to methods and apparatus for evaluating electronic circuit operation in response to different power supply slew times.

BACKGROUND OF THE INVENTION

Environmental testing is widely used to confirm that electronic circuits will operate as intended under a variety of environmental conditions. Such conditions include, for example, temperature variations, humidity variations, voltage variations and vibration. In such testing, the electronic circuit is subjected to a range of environmental conditions, and operation of the circuit is evaluated. The range of environmental conditions corresponds to and frequently exceeds the range of environmental conditions expected during normal operation. Thus, if the circuit operates according to specification during environmental testing, it can be expected to operate according to specification during normal operation.

Environmental testing may utilize a variety of protocols. An engineering qualification test may be utilized to evaluate a new circuit design. Production environmental testing may be used identify early failures and defects and to thereby increase the probability that each circuit will operate satisfactorily when it is installed in a system and operated under normal conditions. Production testing may involve sampling or 100% testing of production circuits. Environmental testing may be performed at various levels, such as chip level, printed circuit board level and subassembly level.

Notwithstanding the exhaustive nature of prior art environmental testing, it has been found that certain defects are not detected by current environmental test procedures. As used herein, the term "defect" refers to a failure of the electronic circuit to operate according to specification. In particular, an electronic circuit may pass all prior art environmental tests and yet fail to operate properly when it is installed in a system and operated under normal conditions. It is therefore desirable to provide enhanced environmental test methods and apparatus which will identify such defects and thereby increase the integrity of environmental testing.

SUMMARY OF THE INVENTION

According to a first aspect of the invention, a method is provided for testing a unit that requires a power supply for operation. The method comprises the step of applying to a unit under test a power supply having a test slew time that is selected to evaluate operation of the unit under test in a system, observing a response of the unit under test to the power supply having the test slew time and determining the condition of the unit under test based on the response of the unit under test to the power supply having the test slew time.

The step of applying the power supply may include applying the power supply with a maximum test slew time and applying the power supply with a minimum test slew time. In one embodiment, the maximum test slew time may be equal to a maximum operating slew time, and the minimum test slew time may be equal to a minimum operating slew time. In another embodiment, the maximum test slew time may exceed the maximum operating slew time, and the minimum test slew time may be less than the minimum operating slew time. The slew time may be controlled by controlling the slew time of a programmable power supply.

According to another aspect of the invention, apparatus is provided for testing a unit that requires a power supply for operation. The apparatus comprises a programmable power supply for applying to a unit under test a supply voltage with a test slew time that is selected to evaluate operation of the unit under test in a system, and a test device for observing a response of the unit under test to the supply voltage with the test slew time and determining the condition of the unit under test based on the response.

According to a further aspect of the invention, a method is provided for testing a unit that requires a power supply for operation. The method comprises the steps of applying to a unit under test a power supply having a maximum test slew time, applying to the unit under test the power supply having a minimum test slew time, observing the responses of the unit under test to the power supply having the maximum and minimum test slew times, and determining the condition of the unit under test based on the responses of the unit under test.

According to yet another aspect of the invention, a method is provided for testing a unit that requires a power supply for operation. The method comprises the steps of controlling a programmable power supply to generate voltages having one or more test slew times selected to evaluate a unit under test, applying the power supply voltages with the selected test slew times to a unit under test, observing the responses of the unit under test to the power supply voltages with the selected test slew times, and determining the condition of the unit under test based on the responses of the unit under test to the power supply voltages with the selected test slew times.

BRIEF DESCRIPTION OF THE DRAWINGS

For a better understanding of the present invention, reference is made to the accompanying drawings, which are incorporated herein by reference and in which.

DETAILED DESCRIPTION

As indicated above, it has been determined that certain defects in electronic circuits were not detected by prior art environmental test procedures. In particular, certain electronic circuits performed satisfactorily during environmental testing and yet failed to operate according to specification when they were installed in a system. It has been discovered that these circuits were sensitive to the slew time, or ramp time, of one or more power supplies. One example is a phase locked loop circuit that failed to operate upon powerup in certain types of systems but not in others due to differences in the slew times of the power supplies in those systems. In another example, a programmable logic device failed to operate according to specification at high temperature when the power supply had a relatively low slew time. Prior art environmental test protocols did not evaluate the sensitivity of electronic circuits to power supply slew time.

Electronic circuits are powered by one or more DC power supplies. When power is applied to a system during normal operation, the power supply transitions from zero volts to normal operating voltage in a slew time that may vary as a function of temperature, age, component tolerances, line voltage, load, and the like. As indicated above, electronic circuits may be sensitive to power supply slew time and may fail to operate within specification for certain slew time values. Power supply slew time and power supply slew rate are equivalent parameters.

In accordance with the invention, electronic circuits are subjected to power supply slew time testing. More particularly, electronic circuits are tested by applying a power supply voltage with one or more test slew times that are selected to evaluate operation of the circuit in a system. The electronic circuit may, for example, be tested by applying the power supply voltage with test slew times that match or exceed the normal range of slew times expected during operation of the electronic circuit in a system. The responses of the electronic circuit to the power supply voltages with the test slew times are observed, and the condition of the circuit is determined from the responses. Typically, a maximum test slew time and a minimum test slew time may be utilized. If the electronic circuit operates according to specification at the maximum and minimum test slew times, it may be expected to operate according to specification when installed in a system.

Figure 1:
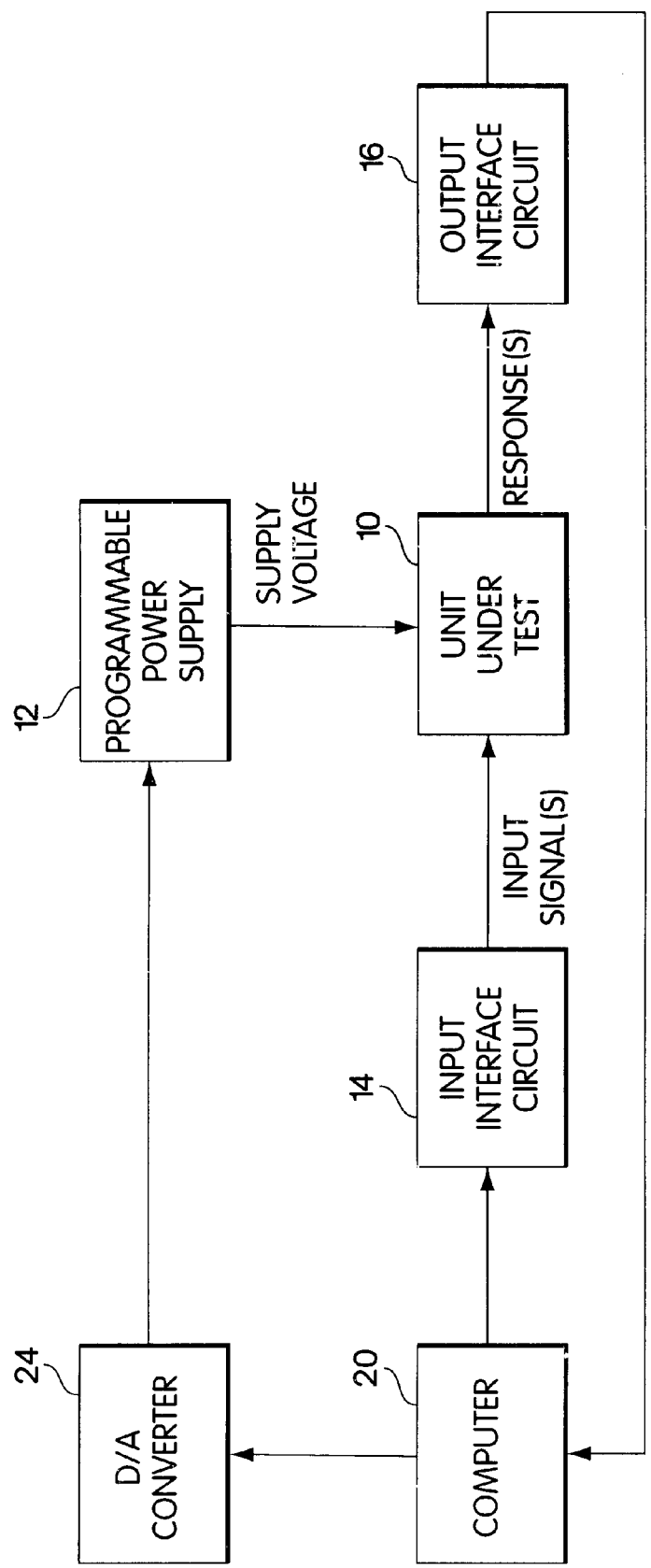
FIG. 1 is a block diagram of an example of a test system suitable for implementing the present invention.

A block diagram of an example of a test system suitable for implementation of the present invention is shown in FIG. 1. A unit under test 10 may be an electronic circuit, an electromechanical or electrooptical device, or any other device that requires one or more supply voltages for operation. A programmable power supply 12 provides a supply voltage to unit under test 10. The supply voltage has a test slew time as described in detail below. The unit under test 10 may, but is not required to, receive one or more signal inputs from an input interface circuit 14 and supplies one or more responses to an output interface circuit 16. The test system may be controlled by a computer 20 or other controller. The computer 20 may supply one or more signals to unit under test 10 through input interface circuit 14 and may receive one or more responses from unit under test 10 through output interface circuit 16. The computer 20 compares the responses with required responses and determines whether the unit under test 10 is operating according to specification. The required responses may, for example, be stored in a memory associated with computer 20.

Computer 20 also controls programmable power supply 12 through a digital-to-analog (D/A) converter 24. The D/A converter 24 provides a control signal to programmable power supply 12. The computer 20 may, for example, provide a series of binary values to D/A converter 24 to cause the power supply 12 to ramp up or down in a selected slew time. The slew times are selected as described below to provide an evaluation of the unit under test 10.

In one example of the test system, the programmable power supply 12 may be an externally controlled variable output switching DC power supply and computer 20 may be a personal computer having a built-in D/A converter. The input interface circuit 14 and the output interface circuit 16 are configured as required for compatibility with unit under test 10 and computer 20. It will be understood that a wide variety of test system configurations may be utilized within the scope of the present invention. For example, digital control of a programmable power supply is not required. All that is required is the capability to apply to the unit under test, a power supply voltage having one or more test slew times selected to evaluate operation of the unit under test in a system.

Figure 2:
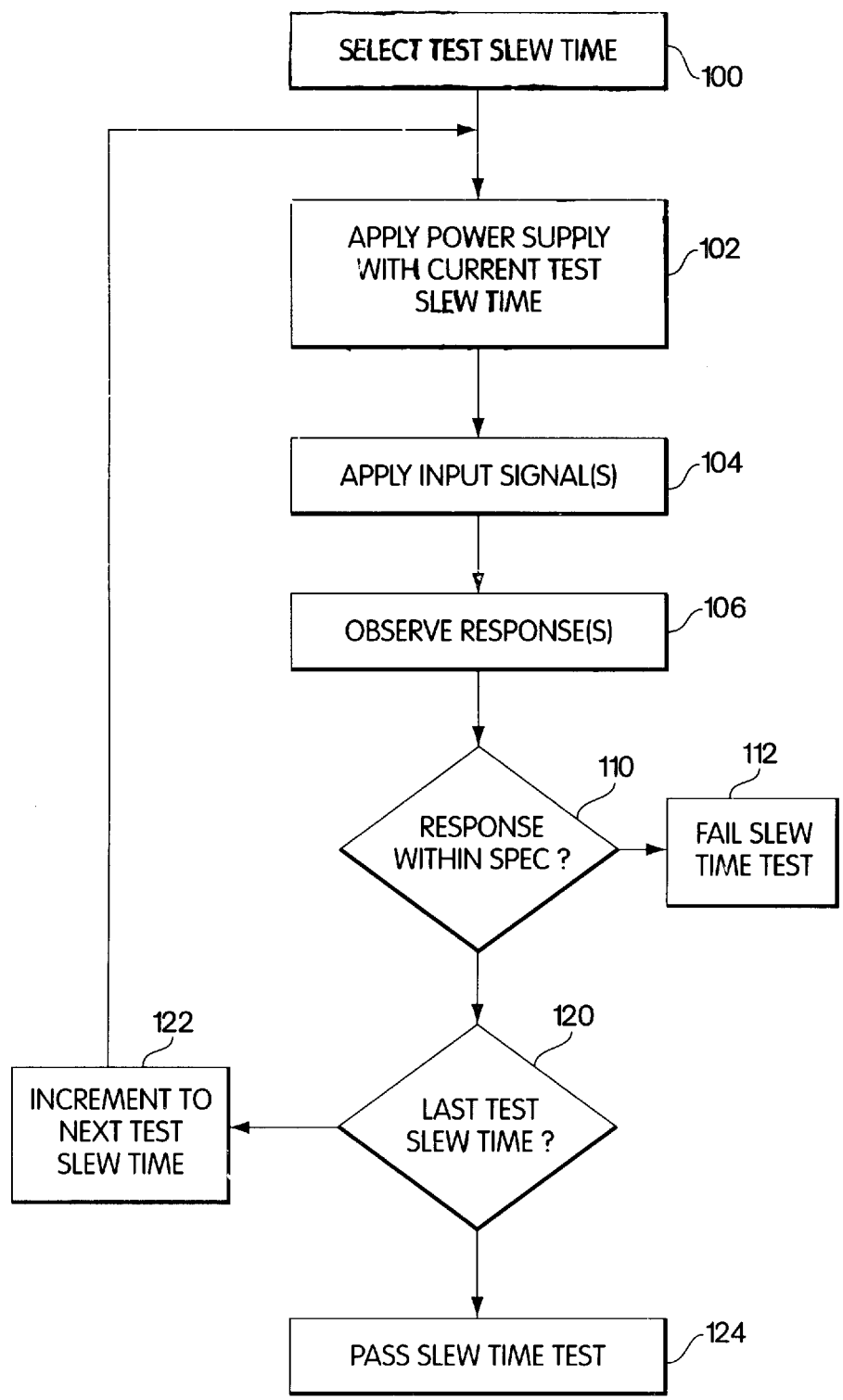
FIG. 2 is a flow chart of an example of a slew time test procedure in accordance with the invention.

FIG. 2 is a flow chart of the steps involved in a power supply slew time test procedure in accordance with the invention. One or more test slew times are selected in step 100. In general, the test slew times are selected to evaluate operation of the unit under test by detecting defects which may occur during normal operation as a result of power supply slew time. A single test slew time may be sufficient. More commonly, maximum and minimum test slew times may be utilized. In some cases, it may be desirable to utilize more than two test slew times. The selection of test slew times is discussed below.

In step 102, the power supply voltage is applied to the unit under test with a currently-selected test slew time. As discussed above, the computer 20 (FIG. 1) may provide a series of digital values to D/A converter 24 to cause programmable power supply 12 to change voltage at the selected test slew time. In step 104, one or more input signals may be applied to the unit under test through input interface circuit 14. It will be understood that in some cases, such as for example an oscillator circuit, it is not necessary to apply input signals. The relative timing of application of the input signals and application of the power supply voltage may be selected to simulate normal operating conditions.

In step 106, the response of the unit under test is observed. For example, computer 20 may receive the response of unit under test 10 through output interface circuit 16. The response may be any number of signals and may be in digital or analog form. When the unit under test is an electromechanical or electrooptical device, the response may be mechanical or optical and the output interface circuit may include a suitable transducer.

The computer 20 or other controller compares the observed response with required responses in step 110. If the response is determined not to be within specification, the unit under test is indicated to have failed the slew time test in step 112. If the observed response is determined to be within specification, a determination is made in step 120 as to whether another test slew time value must be applied to the unit under test. When another test slew time value must be applied to the unit under test, the process increments to the next test slew time in step 122 and returns to step 102 for application to the unit under test of the power supply voltage with the new test slew time. The process is repeated for each of the selected test slew times. When the responses are within specification for all test slew times, the unit under test is indicated in step 124 to have passed the slew time test.

It will be understood that one or more other environmental conditions may be applied to the unit under test during the slew time test. For example, the slew time test may be performed at an elevated temperature or may be repeated at several different temperatures. Furthermore, the slew time test may be performed at one or more AC line voltage conditions. The slew time testing in accordance with the invention may be incorporated into any desired test protocol, such as design verification, production sampling, 100% production testing, and the like.

Selection of test slew times (step 100 in FIG. 2) is described with reference to FIG. 3. Power supply voltage, Vcc, is plotted as a function of time. The power supply voltage may be positive or negative. Furthermore, the unit under test may require more than one power supply voltage. In that case, the slew time test of the present invention may be applied to any or all of the power supply voltages required by the unit under test. The slew time test may be performed sequentially with respect to the different power supplies or may be performed simultaneously.

Referring again to FIG. 3, the slew time of the power supply voltage is defined as the time required for the power supply voltage to transition from a first voltage, such as 0 volts, to a second voltage, such as +5 volts. The slew rate may be constant, indicating a linear voltage increase or decrease, or may be variable, indicating a non-linear voltage increase or decrease. The slew time testing in accordance with the invention may utilize either constant or variable slew rates.

Figure 3:
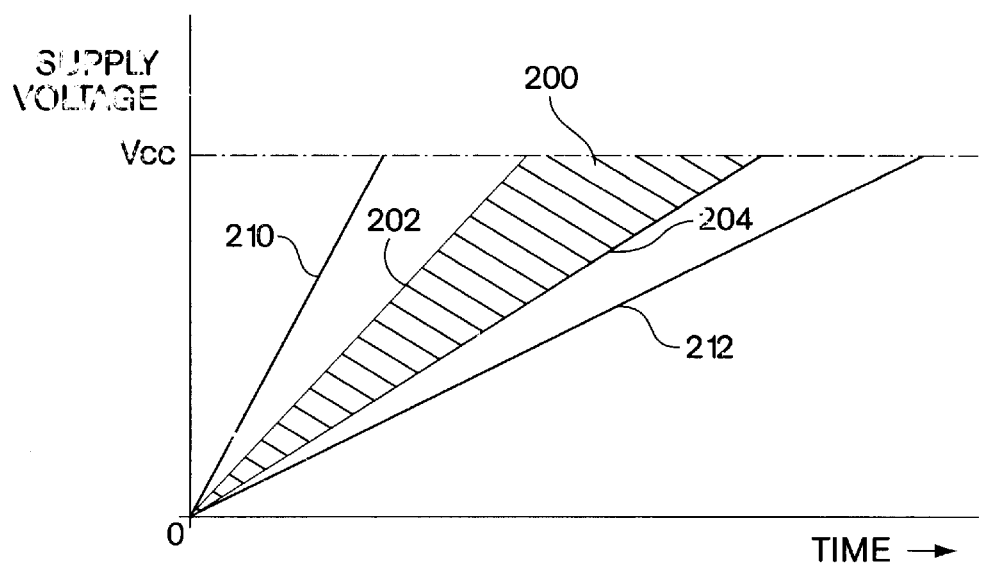
FIG. 3 is a graph of supply voltage as a function of time, illustrating slew time testing in accordance with the invention.

A given unit under test may be subjected to a range of operating slew times, indicated by crosshatched area 200 in FIG. 3, during operation in a system. The range of operating slew times is bounded by a maximum operating slew time 204 and a minimum operating slew time 202. As indicated above, the range of operating slew times results from a variety of factors, including temperature variation, component tolerances, aging, line voltage variations, load variations, and the like. Furthermore, electronic circuits and other devices of interest are frequently utilized in different systems and may be subjected to different power supply slew times. It is desirable to select the test slew times to ensure that the unit under test will operate according to specification independent of these conditions.

According to a first example of a test protocol, the unit under test is tested at a maximum test slew time and a minimum test slew time. The maximum test slew time may be equal to the maximum operating slew time 204, and the minimum test slew time may be equal to the minimum operating slew time 202. This ensures that the unit under test will operate according to specification over the range of expected operating slew times.

According to a second example of a test protocol, the unit under test is tested at maximum and minimum test slew times that provide a margin of safety. With reference to FIG. 3, a maximum test slew time 212 exceeds the maximum operating slew time 204, and a minimum test slew time 210 is less than the minimum operating slew time 202. This protocol provides added confidence that the unit under test will operate according to specification under all expected conditions.

According to a third example of a test protocol, a single test slew time, sufficient for evaluation of the unit under test, is selected. Typically, problems are observed when the power supply slew time is relatively long. Thus, a single maximum test slew time, such as test slew time 212, may be utilized.

By way of example, minimum test slew times are typically in a range of about 5 volts in 1 to 20 milliseconds and maximum test slew times are typically in a range of about 5 volts in 150 to 500 milliseconds. However, these test slew times are given by way of example only and are not limiting as to the scope of the present invention. Typically, the test slew time is in a range of about 20 to 200 milliseconds.

A number of variations are included within the scope of the invention. The final voltage level of the power supply may be varied, for example between 4.6 volts and 5.6 volts, and the response of the unit under test to a programmed test slew time may be observed for each final voltage level. In addition, the power off cycle, such as from voltage Vcc to 0 volts, may be tested. Furthermore, the response of the unit under test to a transition between two nonzero power supply voltages at a programmed test slew time may be tested.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A method for testing a unit that requires a power supply for operation, comprising the steps of:

applying to a unit under test a power supply voltage having a test slew time that is selected to evaluate the response of the unit under test to a transient power supply voltage that occurs when the power supply is turned on or turned off;

observing a response of the unit under test to the power supply voltage having said test slew time; and determining a condition of the unit under test based on the response of the unit under test to the power supply voltage having said test slew time.

2. A method for testing as defined in claim 1 wherein the step of applying a power supply voltage includes applying the power supply voltage with a maximum test slew time that exceeds an operating slew time and applying the power supply voltage with a minimum test slew time that is less than said operating slew time.

3. A method for testing as defined in claim 2 wherein said operating slew time is within a range of values between a maximum operating slew time and a minimum operating slew time, and wherein said maximum test slew time is equal to said maximum operating slew time and said minimum test slew time is equal to said minimum operating slew time.

4. A method for testing as defined in claim 2 wherein said operating slew time is within a range of values between a maximum operating slew time and a minimum operating slew time, and wherein said maximum test slew time exceeds said maximum operating slew time and wherein said minimum slew time is less than said minimum operating slew time.

5. A method for testing as defined in claim 1 wherein said test slew time is in a range of about 20 to 200 milliseconds.

6. A method for testing as defined in claim 2 wherein the step of applying the power supply voltages with said maximum and minimum test slew times includes controlling the slew time of a programmable power supply.

7. A method for testing as defined in claim 6 wherein the step of controlling the slew time comprises controlling a control voltage input of said programmable supply with a digital-to-analog converter.

8. Apparatus for testing a unit that requires a power supply for operation, comprising:

a programmable power supply for applying to a unit under test a power supply voltage with a test slew time that is selected to evaluate the response of the unit under test to a transient power supply voltage that occurs when the power supply is turned on or turned off; and a test device for observing a response of the unit under test to the power supply voltage with said test slew time and determining a condition of the unit under test based on the response.

9. Apparatus as defined in claim 8 further comprising a controller for controlling said programmable power supply, said controller comprising means for applying said power supply voltage to the unit under test with a maximum test slew time equal to a maximum operating slew time and for applying said power supply voltage to the unit under test with a minimum test slew time equal to a minimum operating slew time.

10. Apparatus as defined in claim 8 further comprising a controller for controlling said programmable power supply, said controller comprising means for applying said power supply voltage to the unit under test with a maximum test slew time that exceeds a maximum operating slew time and for applying said power supply voltage to the unit under test with a minimum test slew time that is less than a minimum operating slew time.

11. Apparatus as defined in claim 8 further comprising a controller for controlling said programmable power supply, said controller comprising means for controlling a control voltage input of said programmable power supply with a digital-to-analog converter.

12. A method for testing a unit that requires a power supply for operation, comprising the steps of:

applying to a unit under test a power supply voltage having a maximum test slew time;

applying to the unit under test a power supply voltage having a minimum test slew time, wherein the maximum and minimum test slew times are selected to evaluate the response of the unit under test to a transient power supply voltage that occurs when the power supply is turned on or turned off;

observing the response of the unit under test to the power supply voltages having said maximum and minimum test slew times; and determining a condition of the unit under test based on the response of the unit under test.

13. A method for testing as defined in claim 12 wherein said maximum test slew time is equal to a maximum operating slew time and said minimum test slew time is equal to a minimum operating slew time.

14. A method for testing as defined in claim 12 wherein said maximum test slew time exceeds a maximum operating slew time and said minimum test slew time is less than a minimum operating slew time.

15. A method for testing a unit that requires a power supply for operation, comprising the steps of:

controlling a programmable power supply to generate power supply voltages having one or more test slew times selected to evaluate the response of a unit under test to a transient power supply voltage that occurs when the power supply is turned on or turned off;

applying the power supply voltages with the selected test slew times to a unit under test;

observing the responses of the unit under test to the power supply voltages with the selected test slew times; and determining the condition of the unit under test based on the responses of the unit under test to the power supply voltages with the selected test slew times.

\* \* \* \* \*